(12) United States Patent
Zhang

(10) Patent No.: US 8,373,983 B2
(45) Date of Patent: Feb. 12, 2013

(54) SERVER

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 290 days.

(21) Appl. No.: 12/978,424

(22) Filed: Dec. 24, 2010

(65) Prior Publication Data

US 2012/0134096 A1 May 31, 2012

(30) Foreign Application Priority Data

Nov. 30, 2010 (TW) .............................. 99141544 A

(51) Int. Cl.
*H05K 5/00* (2006.01)
*H05K 7/16* (2006.01)
*H05K 7/14* (2006.01)
*H01R 4/00* (2006.01)
*H01R 13/46* (2006.01)

(52) U.S. Cl. ......... 361/679.33; 361/679.37; 361/379.39; 361/727; 174/542; 174/559; 174/59

(58) Field of Classification Search .. 361/679.31–679.4, 361/679.55–679.6, 724–727; 174/363–387, 174/542, 559–563, 59–64, 138 B, 138 D, 174/170; 439/157, 60, 152–153, 327, 328, 439/331
See application file for complete search history.

(56) References Cited

U.S. PATENT DOCUMENTS

| 6,621,692 B1* | 9/2003 | Johnson et al. .......... 361/679.55 |
| 2003/0042824 A1* | 3/2003 | Coffin et al. ................ 312/223.2 |
| 2008/0164795 A1* | 7/2008 | Peng et al. .................. 312/334.5 |

* cited by examiner

*Primary Examiner* — Zachary M Pape
*Assistant Examiner* — Jerry Wu
(74) *Attorney, Agent, or Firm* — Jianq Chyun IP Office

(57) ABSTRACT

A server includes a chassis, a hard disc module and a cable arranging module. The hard disc module disposed in the chassis is suitable for being pulled out from the chassis. The hard disc module includes a hard disc frame, a back plate and a hard disc plugging opening. The hard disc frame has first and second sides. The back plate and the hard disc plugging opening are located at the first and second sides respectively. The cable arranging module includes a cable set, a fixed frame and a flexible frame. The cable set is connected to the hard disc module. The fixed frame is fixed in the chassis, in which a part of the cable set is fixed to the fixed frame. The flexible frame is connected between the fixed frame and the hard disc frame. The cable set is located in the fixed frame and the flexible frame.

8 Claims, 10 Drawing Sheets

SERVER

CROSS-REFERENCE TO RELATED APPLICATION

This application claims the priority benefit of Taiwan application serial no. 99141544, filed on Nov. 30, 2010. The entirety of the above-mentioned patent application is hereby incorporated by reference herein and made a part of this specification.

BACKGROUND OF THE INVENTION

1. Field of the Invention

The present invention generally relates to a server, in particular, to a server having a removable hard disc module.

2. Description of Related Art

A server is the core which serves all the computers in a network system and has the functions of providing network users discs, printing service, and so forth. Also, the server allows the users to share the resources in the network. The basic structure of the server is approximately the same as that of an ordinary personal computer and includes a central processing unit (CPU), a memory and Input/Output (I/O) devices, which are connected by a bus inside. Through north bridge chips, the CPU and the memory are connected, and through south bridge chips, the I/O devices are connected. Based on the structure of a chassis, the development of the server may be roughly divided into three phases: developing from the early tower chassis to the rack mountable chassis which focuses on compact property, and then to the blade server which focuses on high density computing.

The rack mountable server is given as an example here. The rack mountable server is a server which has appearance of standard design and used together with the chassis. In other words, the rack mountable server is a tower server having superior design, and its purpose is to reduce the space occupied in the server as much as possible. A great deal of professional network devices adopts the rack mountable structure, which is mostly flat type, like drawers. The network devices are, for example, switches, routers, and hardware firewalls. The rack mountable server is 19 inches wide, and the height thereof is measured by the unit, U (1U=1.75 inches=44.45 millimeters). Generally speaking, the server is classified into 1U, 2U, 3U, 4U, 5U, and 7U types.

The size of the chassis is also regulated by industrial standards, generally from 22U to 42U. Detachable sliding trays may be disposed in the chassis based on the height (U) of the chassis. The user may flexibly adjust the height, according to the level of the server, for storing network devices, such as servers, hubs, and disc array cabinets. After the server is placed, all the I/O wires thereof may be led out from the rear of the chassis and organized in the wire trenches of the chassis (all the interfaces of the rack mountable server are also located at the rear). Number labels are commonly used to facilitate management.

For a server having a removable hard disc module, when the hard disc module moves relatively to the chassis, cables connected to the hard disc module are moved or curved accordingly. If the cables are not properly fixed and thus are irregularly curved, the cables may fall off from the hard disc module. Therefore, it is important to improve the degree of freedom in curving the cables while preventing the cables from falling off from the hard disc module.

SUMMARY OF THE INVENTION

Accordingly, the present invention is directed to a server, which has a cable arranging module capable of preventing a cable set from falling off.

The present invention provides a server, which includes a chassis, a hard disc module and a cable arranging module. The chassis has two side plates. The hard disc module is disposed in the chassis and suitable for being pulled out from the chassis. The hard disc module includes a hard disc frame, a back plate and a hard disc plugging opening. The hard disc frame has a first side and a second side. The back plate is located at the first side of the hard disc frame and parallel to the two side plates. The hard disc plugging opening is formed at the second side of the hard disc frame. The cable arranging module includes a cable set, a fixed frame and a flexible frame. The cable set is connected to the hard disc module. The fixed frame is fixed in the chassis, in which a part of the cable set is fixed to the fixed frame. The flexible frame has a first end and a second end. The first end is connected to the fixed frame, and the second end is connected to the hard disc frame. A containing space is formed by the fixed frame and the flexible frame, and the cable set is located in the containing space. When the hard disc module drives the second end of the flexible frame to move relatively to the chassis, the cable set is curved with the flexible frame.

In an embodiment of the present invention, the back plate has a plurality of connectors, the cable set includes a plurality of cables, the cables are connected to the connectors respectively, a first segment of each cable is fixed to the fixed frame, and a second segment of each cable is fixed to the flexible frame.

In an embodiment of the present invention, the fixed frame includes a main body and a plurality of limiting arms. The limiting arms extend from the main body, in which the first segments are limited on the main body by the limiting arms.

In an embodiment of the present invention, the flexible frame includes a plurality of pivoting members, the pivoting members are pivoted in sequence to form a chain structure, each pivoting member has at least one limiting arm, and the second segments are limited on the pivoting members by the limiting arms.

In an embodiment of the present invention, the cable set includes a power cable and a plurality of data transmission cables.

In an embodiment of the present invention, the server further includes a motherboard module, disposed in the chassis, in which the cable arranging module is located between the motherboard module and the hard disc module.

In an embodiment of the present invention, the server further includes a connecting rod, in which one end of the connecting rod is pivoted to the hard disc module, and the other end of the connecting rod is pivoted to the second end of the flexible frame.

In an embodiment of the present invention, the server further includes an adapter plate located in the chassis, in which one end of the cable set is connected to the adapter plate through an opening of the fixed frame, and the other end of the cable set is connected to the back plate through an opening of the flexible frame.

In an embodiment of the present invention, the server further includes a first slide rail, a second slide rail, a first slide member and a second slide member. The first slide rail and the second slide rail are disposed in the chassis and parallel to the two side plates. The first slide member and the second slide member are slideably disposed in the first slide rail and the second slide rail respectively, in which the hard disc frame is connected to the first slide member and the second slide member and located between the first slide rail and the second slide rail, and the hard disc module is suitable for being completely pulled out from a front end of the chassis as the first slide member and the second slide member slide relatively to the first slide rail and the second slide rail.

In an embodiment of the present invention, the fixed frame extends along a first axis, the first axis is parallel to an extending direction of the first slide rail and located below the first slide rail, and when the hard disc module is located in the chassis, a part of the flexible frame is supported on the first slide rail and located on a second axis parallel to the first axis, and when the hard disc module slides out from the chassis along the first slide rail and the second slide rail, the flexible frame supported on the first slide rail moves away from the first slide rail along the second axis and at least partially moves to the first axis, and a part of the cable set is curved with the flexible frame.

Based on the above, the cable arranging module of the present invention includes the fixed frame and the flexible frame, and the cable set is fixed to the fixed frame and the flexible frame. When the hard disc module moves relatively to the chassis, a partial segment of the cable set can be curved with the flexible frame so that the whole structure has sufficient degrees of freedom in movement. Since one end of the flexible frame is connected to the hard disc module, relative positions of an end of the cable set and the hard disc module can be maintained, so as to prevent the cable set from falling off from the hard disc module due to movement of the hard disc module.

In order to make the aforementioned features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
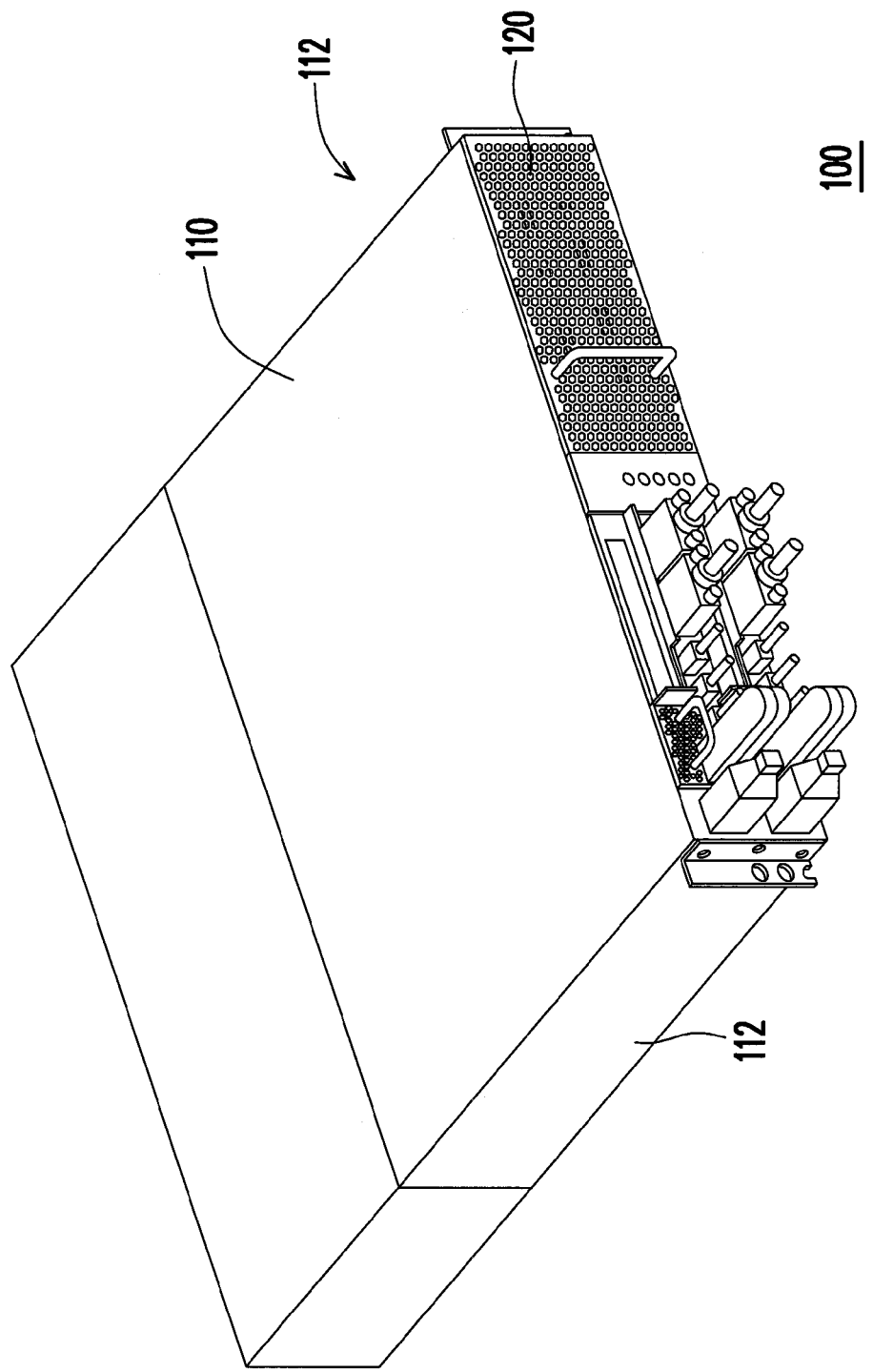
FIG. 1 is a three-dimensional view of a server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
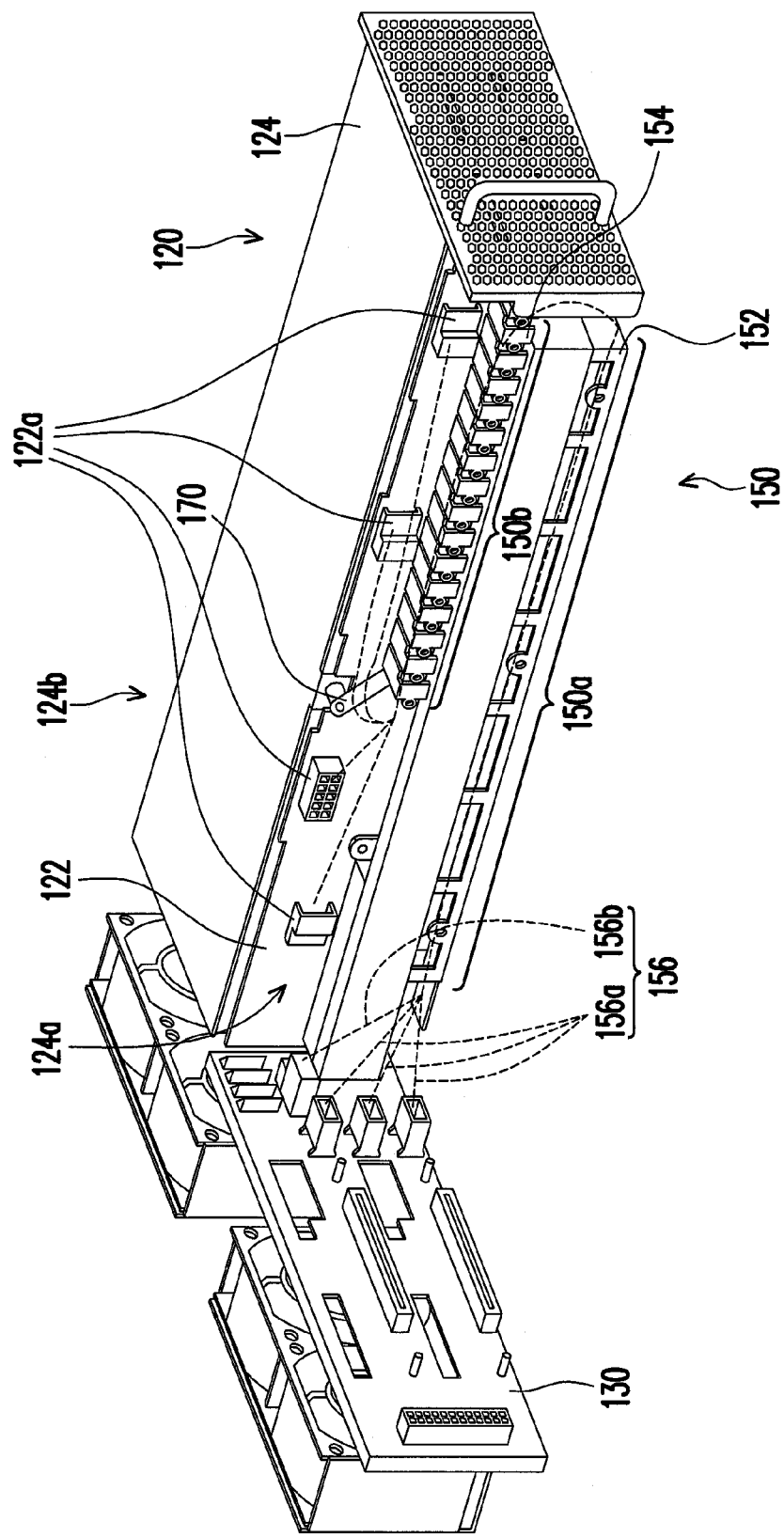
FIG. 2 is a three-dimensional view of some components of the server in FIG. 1.

FIG. 1 is a three-dimensional view of a server according to an embodiment of the present invention. FIG. 2 is a three-dimensional view of some components of the server in FIG. 1. To clearly illustrate the figures, cables 140 in FIG. 2 are depicted by dashed lines. Referring to FIGS. 1 and 2, the server 100 of this embodiment includes a chassis 110, a hard disc module 120, an adapter plate 130 and a cable arranging module 150. The chassis 110 has two side plates 112. The hard disc module 120 is disposed in the chassis 110 and suitable for being pulled out from the chassis 110. The hard disc module 120 includes a hard disc frame 124 and a back plate 122. The hard disc frame 124 has a first side 124a and a second side 124b. The back plate 122 is located at the first side 124a of the hard disc frame 124 and parallel to the two side plates 112. The adapter plate 130 is disposed in the chassis 110. The cable arranging module 150 includes a cable set 156, a fixed frame 152 and a flexible frame 154. The cable set 156 has a first segment 150a and a second segment 150b, the first segment 150a is connected to the adapter plate 130, and the second segment 150b is connected to the hard disc module 120. The fixed frame 152 is fixed in the chassis 110. The first segment 150a is fixed to the fixed frame 152. Two ends of the flexible frame 154 are connected to the fixed frame 152 and the hard disc frame 124 respectively. The second segment 150b is fixed to the flexible frame 154. In other words, a containing space is formed by the fixed frame 152 and the flexible frame 154, and the cable set 156 is located in the containing space. In this embodiment, one end of the cable set 156 is connected to the adapter plate 130 through an opening of the fixed frame 152, and the other end of the cable set 156 is connected to the back plate 122 through an opening of the flexible frame 154.

Figure 3:
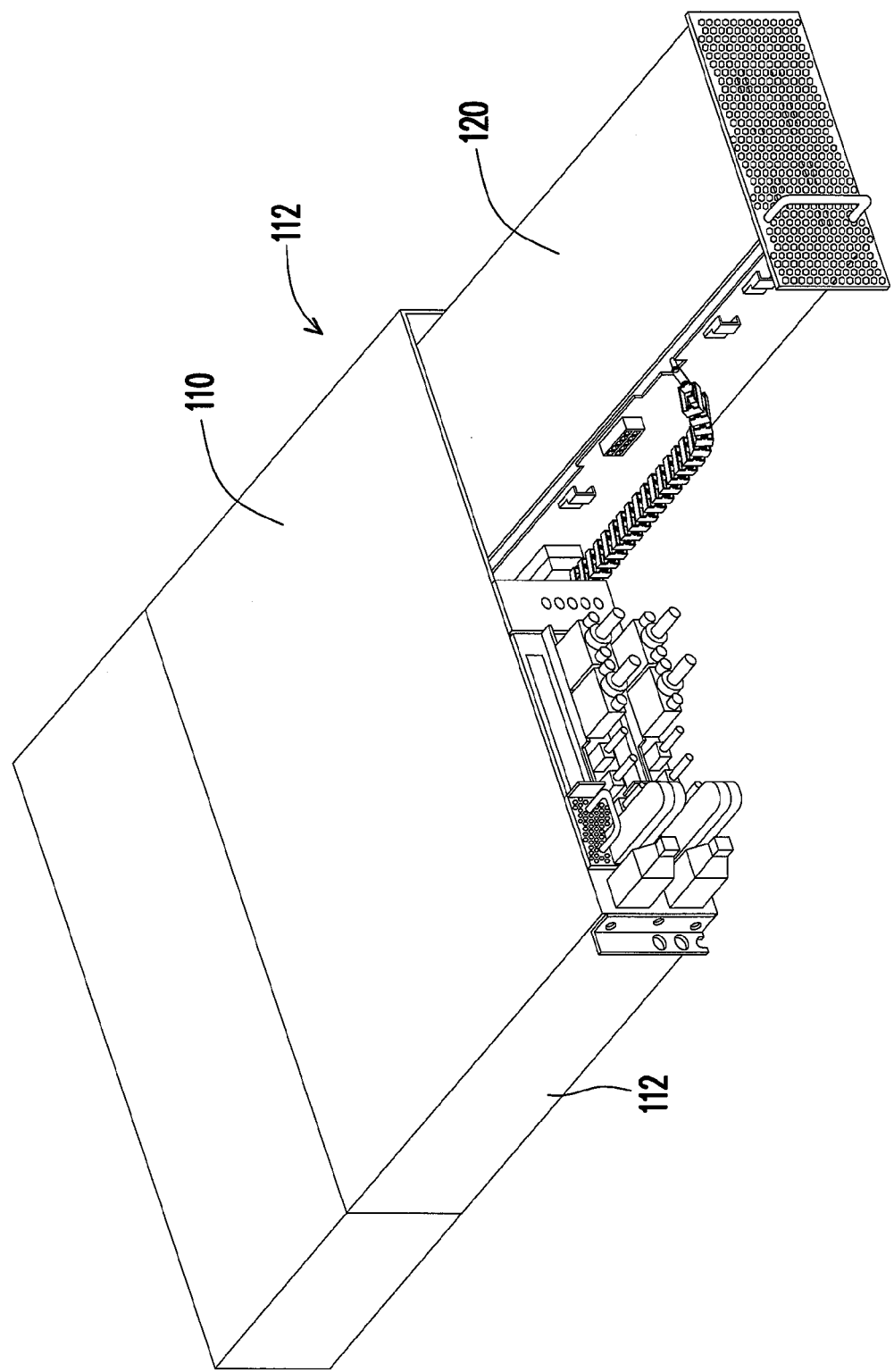
FIG. 3 is a three-dimensional view of a hard disc module being pulled out from a chassis in FIG. 1.
Figure 4:
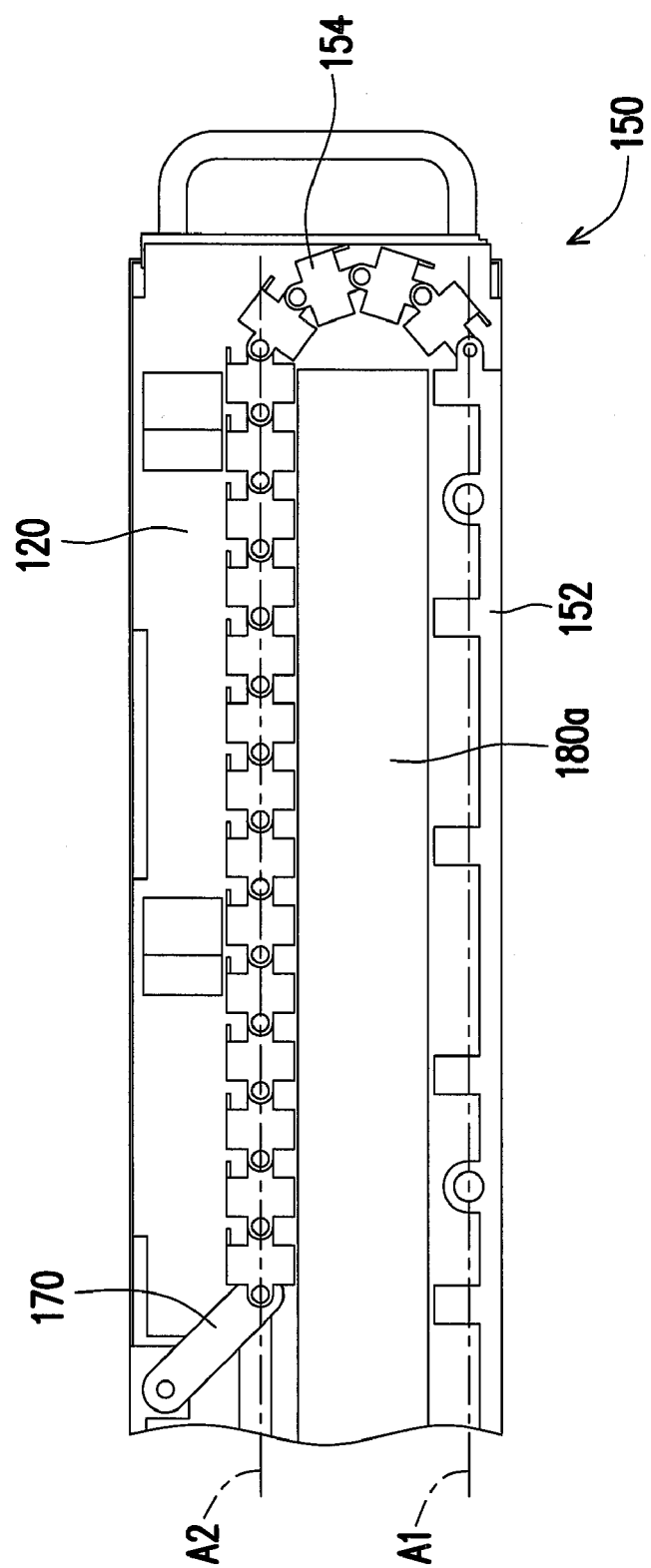
FIG. 4 is a partial side view of a cable arranging module in FIG. 1.
Figure 5:
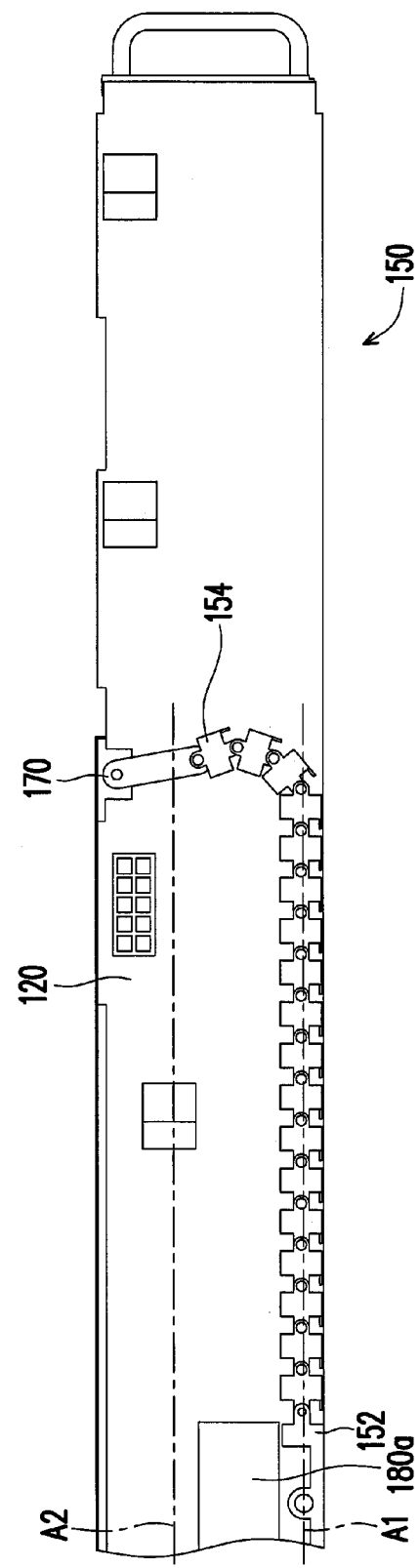
FIG. 5 is a partial side view of the cable arranging module in FIG. 3.

FIG. 3 is a three-dimensional view of a hard disc module being pulled out from a chassis in FIG. 1. FIG. 4 is a partial side view of a cable arranging module in FIG. 1. FIG. 5 is a partial side view of the cable arranging module in FIG. 3. When a user pulls the hard disc module 120 out from the chassis 110 (as shown in FIGS. 3 and 5) or pushes the hard disc module 120 into the chassis 110 (as shown in FIGS. 1 and 4), one end of the flexible frame 154 connected to the hard disc module 120 is driven to move relatively to the chassis 110. In this process, the second segment 150b (shown in FIG. 2) is curved with the flexible frame 154, so that the whole structure has sufficient degrees of freedom in movement. Since one end of the flexible frame 154 is connected to the hard disc module 120, relative positions of an end of the cable set 156 (shown in FIG. 2) and the hard disc module 120 can be maintained, so as to prevent the cable set 156 from falling off from the hard disc module 120 due to movement of the hard disc module 120.

Referring to FIG. 2, in particular, the cable set 156 of this embodiment includes a plurality of cables, and the cables include a plurality of data transmission cables 156a and a power cable 156b. The back plate 122 has a plurality of connectors 122a and is connected to the cable set 156 through the connectors 122a, for data and power transmission. The data transmission cables 156a and the power cable 156b are fixed to the flexible frame 154, extend out from an end of the flexible frame 154, and are then connected to the back plate 122. The end of the flexible frame 154 is fixed to the hard disc module 120, so that relative positions of segments of the data transmission cables 156a and the power cable 156b at the end and the hard disc module 120 can be maintained, so as to reduce the probability of the data transmission cables 156a and the power cable 156b falling off from the hard disc module 120.

Figure 6:
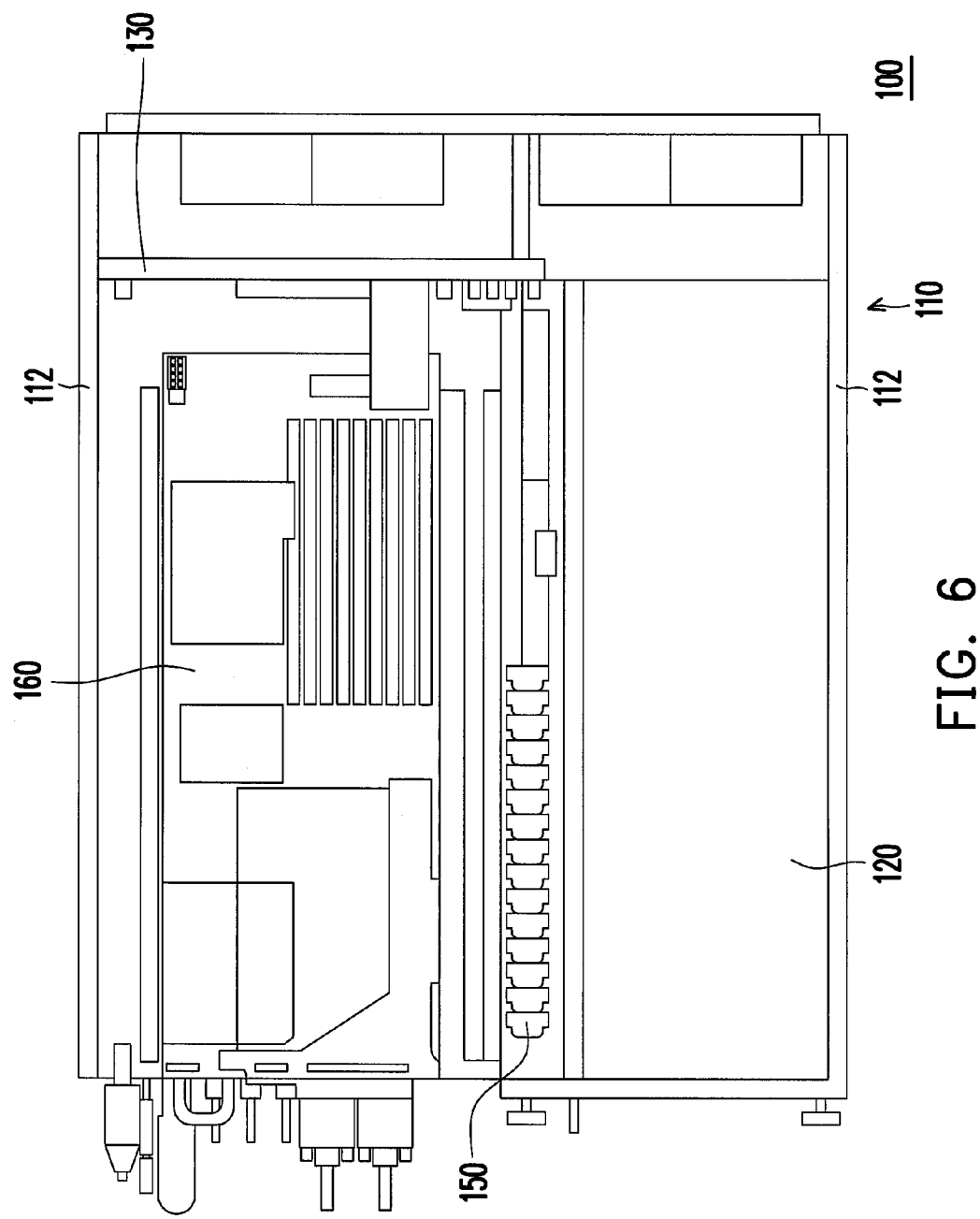
FIG. 6 is a top view of the server in FIG. 1.

FIG. 6 is a top view of the server in FIG. 1. To clearly illustrate the figures, FIG. 6 does not show a top surface of the chassis 110. Referring to FIG. 6, the server 100 of this embodiment further includes a motherboard module 160. The motherboard module 160 is disposed in the chassis 110, and the cable arranging module 150 is located between the motherboard module 160 and the hard disc module 120. Such a high-density configuration enables the server 100 to have a small volume, thereby saving the configuration space.

Figure 7:
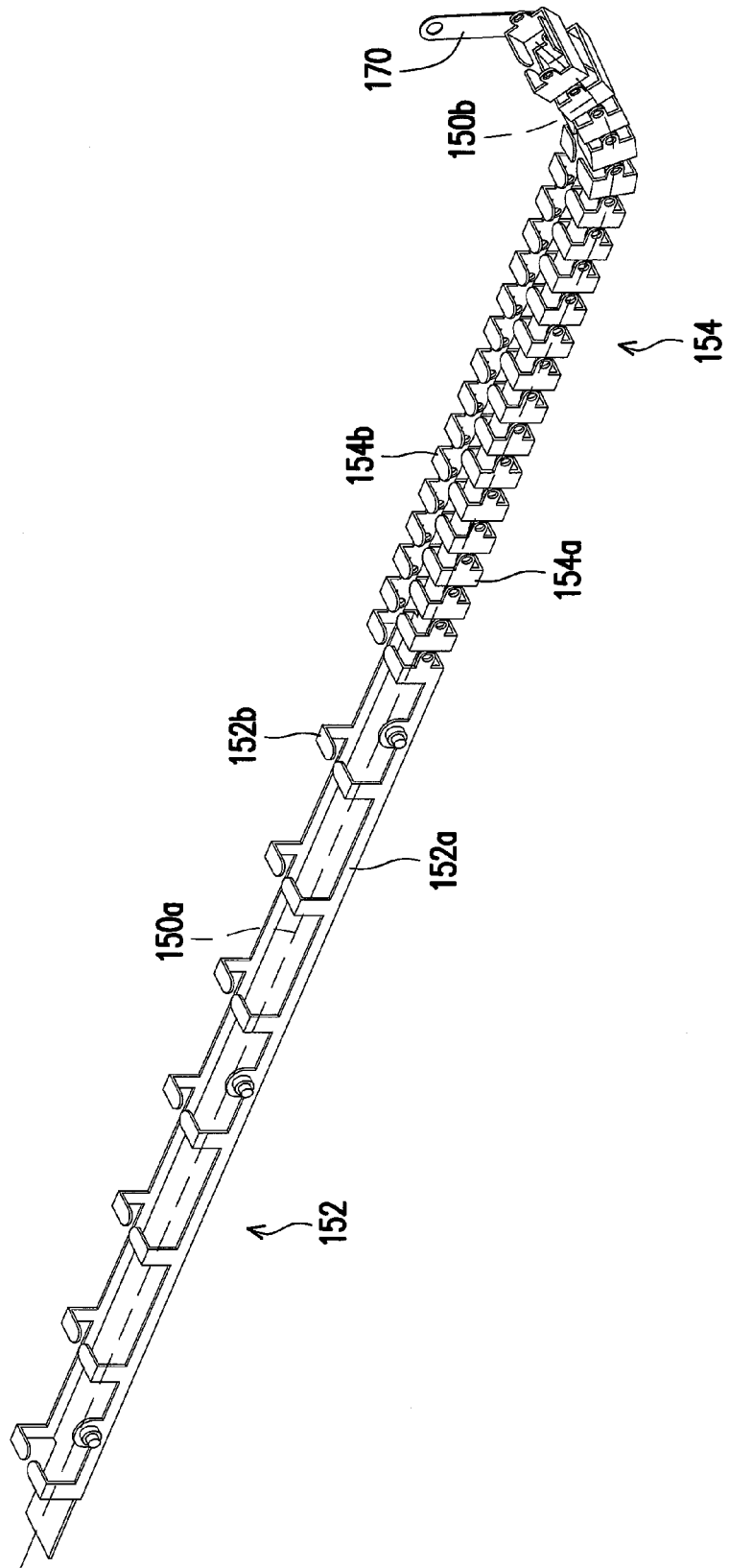
FIG. 7 is a three-dimensional view of a fixed frame and a flexible frame in FIG. 5.

FIG. 7 is a three-dimensional view of a fixed frame and a flexible frame in FIG. 5. Referring to FIG. 7, in this embodiment, the fixed frame 152 includes a main body 152a and a plurality of limiting arms 152b. The limiting arms 152b extend from the main body 152a. The first segments 142 (depicted by dashed lines) are limited on the main body 152a by the limiting arms 152b, so as to fix the cables 140 (shown in FIG. 2). Moreover, the flexible frame 154 includes a plurality of pivoting members 154a. The pivoting members 154a are pivoted in sequence to form a chain structure suitable for being curved. Each pivoting member 154a has at least one limiting arm 154b, and the second segments 144 (depicted by dashed lines) are limited on the pivoting members 154a by the limiting arms 154b, so as to fix the cables 140 (shown in FIG. 2). In addition, referring to FIGS. 4 and 5, in this embodiment, the server 100 further includes a connecting rod 170. One end of the connecting rod 170 is pivoted to the hard disc module 120, and the other end of the connecting rod 170 is pivoted to the flexible frame 154. The angle of the connecting rod 170 relative to the flexible frame 154 can be designed so as to enable the user to drive the whole structure to move between the positions in FIGS. 4 and 5 easily and smoothly.

Figure 8:
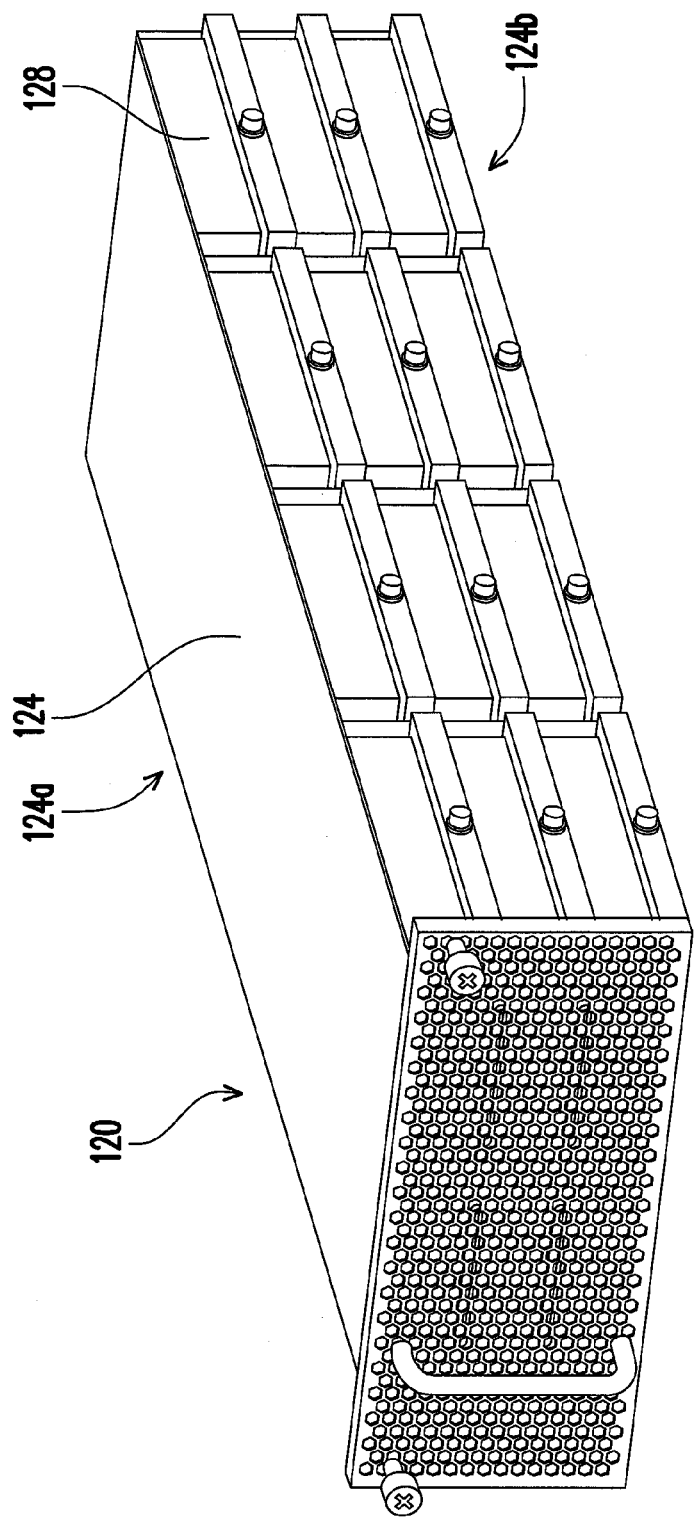
FIG. 8 is a three-dimensional view of the hard disc module in FIG. 1.
Figure 9:
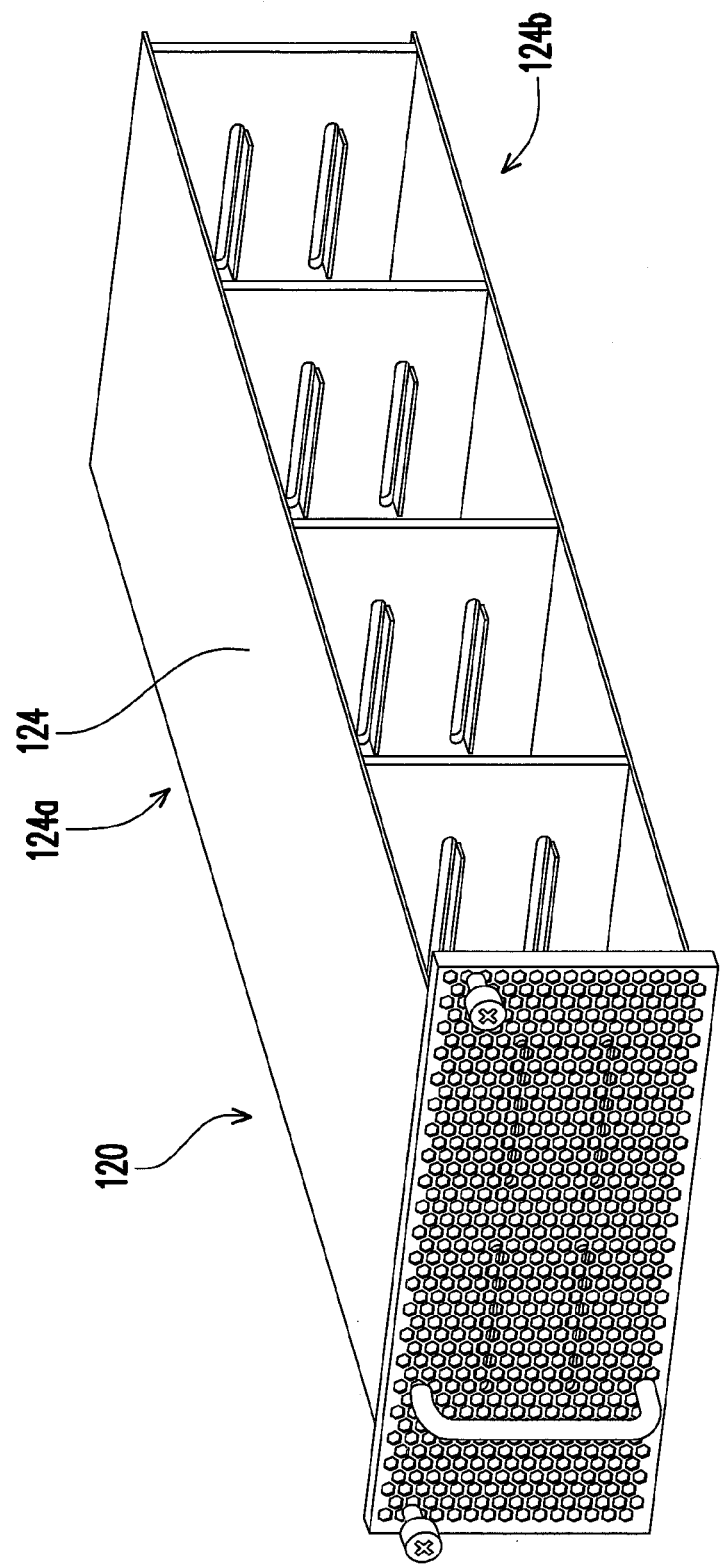
FIG. 9 is a three-dimensional view of some components of the hard disc module in FIG. 8.

FIG. 8 is a three-dimensional view of the hard disc module in FIG. 1. FIG. 9 is a three-dimensional view of some components of the hard disc module in FIG. 8. The hard disc module 120 of this embodiment further includes a hard disc plugging opening 126. The hard disc plugging opening 126 is formed at the second side 124b of the hard disc frame 124. The user can remove a hard disc 128 located in the hard disc frame 124 through the hard disc plugging opening 126.

Figure 10:
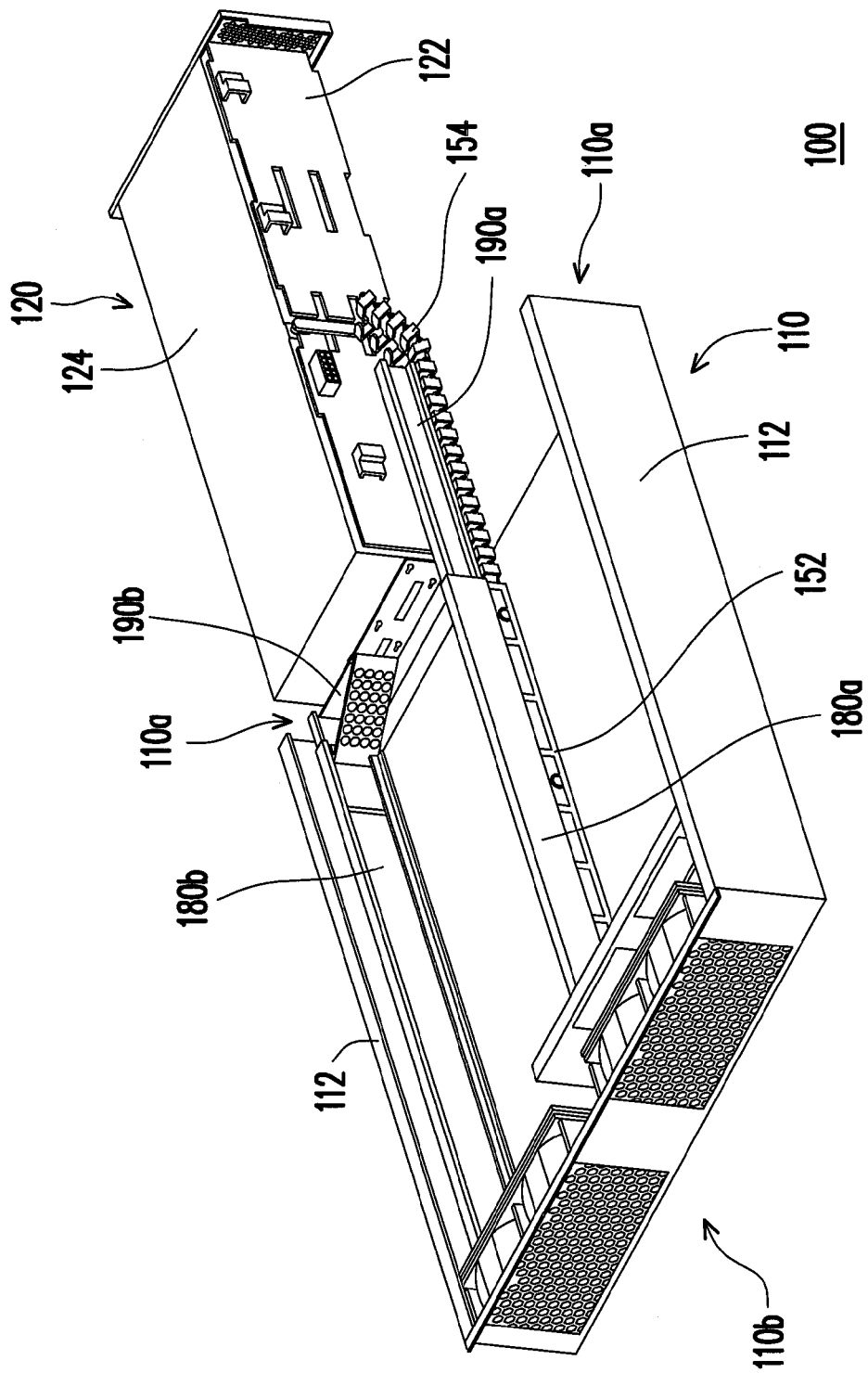
FIG. 10 is a schematic view of the hard disc module being pulled out from the chassis in FIG. 1.

FIG. 10 is a schematic view of the hard disc module being pulled out from the chassis in FIG. 1. Referring to FIG. 10, in this embodiment, the server 100 further includes a first slide rail 180a, a second slide rail 180b, a first slide member 190a and a second slide member 190b. The first slide rail 180a and the second slide rail 180b are disposed in the chassis 110 and parallel to the two side plates 112. The first slide member 190a and the second slide member 190b are slideably disposed in the first slide rail 180a and the second slide rail 180b respectively, in which the hard disc frame 124 is connected to the first slide member 190a and the second slide member 190b and located between the first slide rail 180a and the second slide rail 180b. The hard disc module 120 is suitable for being completely pulled out from a front end 110a of the chassis 110 as the first slide member 190a and the second slide member 190b slide relatively to the first slide rail 180a and the second slide rail 180b, as shown in FIG. 10.

Referring to FIGS. 4 and 5, in this embodiment, the fixed frame 152 extends from the first axis A1, the first axis A1 is parallel to an extending direction of the first slide rail 180a and located below the first slide rail 180a. When the hard disc module 120 is located in the chassis 110, a part of the flexible frame 154 is supported on the first slide rail 180a and located on a second axis A2 parallel to the first axis A1, as shown in FIG. 4. When the hard disc module 120 slides out from the chassis 110 along the first slide rail 180a and the second slide rail 180b as shown in FIG. 10, the flexible frame 154 supported on the first slide rail 180a moves away from the first slide rail 180a along the second axis A2 and at least partially moves to the first axis A1, and a part of the cable set 156 (shown in FIG. 2) is curved with the flexible frame 154.

Based on the above, the cable arranging module of the present invention includes the fixed frame and the flexible frame, and the cable set is fixed to the fixed frame and the flexible frame. When the hard disc module moves relatively to the chassis, a partial segment of the cable set can be curved with the flexible frame so that the whole structure has sufficient degrees of freedom in movement. Since one end of the flexible frame is connected to the hard disc module, relative positions of an end of the cable set and the hard disc module can be maintained, so as to prevent the cable set from falling off from the hard disc module due to movement of the hard disc module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server, comprising: a chassis, comprising two side plates; a hard disc module, disposed in the chassis and suitable for being pulled out from the chassis, the hard disc module comprising: a hard disc frame, comprising a first side and a second side; a back plate, located at the first side of the hard disc frame and parallel to the two side plates; and a hard disc plugging opening, formed at the second side of the hard disc frame; and a cable arranging module located at the first side of the hard disc frame, comprising: a cable set, connected to the hard disc module; a fixed frame, fixed in the chassis, wherein a part of the cable set is fixed to the fixed frame; and a flexible frame, comprising a first end and a second end, wherein the first end is connected to the fixed frame, the second end is connected to the hard disc frame, a containing space is formed by the fixed frame and the flexible frame and limited by a plurality of L-shaped limiting arms, and the cable set is located in the containing space, wherein when the hard disc module drives the second end of the flexible frame to move relatively to the chassis, the cable set is curved with the flexible frame; and a first slide rail and a second slide rail, disposed in the chassis and parallel to the two side plates; and a first slide member and a second slide member, slideably disposed on the first slide rail and the second slide rail respectively, wherein the back plate of the hard disc frame is connected to the first slide member and an adjacent rear side of the hard disc frame is connected to the second slide member, and the hard disc module is suitable for being completely pulled out from a front end of the chassis as the first slide member and the second slide member slide relatively to the first slide rail and the second slide rail, wherein the hard disc plugging opening is exposed.

2. The server according to claim 1, wherein the back plate comprises a plurality of connectors, the cable set comprises a plurality of cables, the cables are connected to the connectors respectively, a first segment of each cable is fixed to the fixed frame, and a second segment of each cable is fixed to the flexible frame.

3. The server according to claim 2, wherein the flexible frame comprises a plurality of pivoting members, the pivoting members are pivoted in sequence to form a chain structure, each pivoting member comprises at least one limiting arm, and the second segments are limited on the pivoting members by the limiting arms.

4. The server according to claim 1, wherein the cable set comprises a power cable and a plurality of data transmission cables.

5. The server according to claim 1, further comprising a motherboard module, disposed in the chassis, wherein the cable arranging module is located between the motherboard module and the hard disc module.

6. The server according to claim 1, further comprising a connecting rod, wherein one end of the connecting rod is pivoted to the hard disc module, and the other end of the connecting rod is pivoted to the second end of the flexible frame.

7. The server according to claim 1, further comprising an adapter plate located in the chassis, wherein one end of the cable set is connected to the adapter plate through an opening of the fixed frame, and the other end of the cable set is connected to the back plate through an opening of the flexible frame.

8. The server according to claim 1, wherein the fixed frame extends along a first axis, the first axis is parallel to an extending direction of the first slide rail and located below the first slide rail, and when the hard disc module is located in the chassis, a part of the flexible frame is supported on the first slide rail and located on a second axis parallel to the first axis, and when the hard disc module slides out from the chassis along the first slide rail and the second slide rail, the flexible frame supported on the first slide rail moves away from the first slide rail along the second axis and at least partially moves to the first axis, and a part of the cable set is curved with the flexible frame.

* * * * *